(12) United States Patent
Funakoshi

(10) Patent No.: US 6,587,801 B2
(45) Date of Patent: Jul. 1, 2003

(54) ABNORMALITY-CAUSE IDENTIFYING APPARATUS AND METHOD

(75) Inventor: Haruo Funakoshi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 24 days.

(21) Appl. No.: 09/759,447

(22) Filed: Jan. 16, 2001

(65) Prior Publication Data

US 2002/0022937 A1 Feb. 21, 2002

(30) Foreign Application Priority Data

Jul. 24, 2000 (JP) .................................... 2000-222660

(51) Int. Cl.$^7$ .......................... G01N 37/00; G06F 19/00
(52) U.S. Cl. ....................................................... 702/84
(58) Field of Search ........................ 702/84, 81, 180, 702/182; 700/109, 110, 121; 438/14

(56) References Cited

U.S. PATENT DOCUMENTS

| | | | | |
|---|---|---|---|---|
| 3,751,647 A | * | 8/1973 | Maeder et al. | 713/401 |
| 3,876,872 A | * | 4/1975 | Spitz | 700/34 |
| 5,240,866 A | * | 8/1993 | Friedman et al. | 702/35 |
| 5,301,118 A | * | 4/1994 | Heck et al. | 700/109 |
| 5,381,417 A | * | 1/1995 | Loopik et al. | 714/724 |
| 5,410,469 A | * | 4/1995 | Sakamoto et al. | 700/9 |
| 5,440,649 A | * | 8/1995 | Kiyasu et al. | 382/147 |
| 5,475,695 A | * | 12/1995 | Caywood et al. | 714/738 |
| 5,561,760 A | * | 10/1996 | Ferris et al. | 714/25 |
| 5,586,252 A | * | 12/1996 | Barnard et al. | 714/48 |
| 5,808,919 A | * | 9/1998 | Preist et al. | 702/183 |
| 5,991,699 A | * | 11/1999 | Kulkarni et al. | 702/83 |
| 6,009,545 A | * | 12/1999 | Tsutsui et al. | 714/718 |
| 6,047,083 A | * | 4/2000 | Mizuno | 382/141 |
| 6,091,846 A | * | 7/2000 | Lin et al. | 382/145 |
| 6,133,727 A | * | 10/2000 | Chun et al. | 324/158.1 |
| 6,154,714 A | * | 11/2000 | Lepejian | 702/118 |
| 6,157,444 A | * | 12/2000 | Tomita et al. | 356/237.1 |
| 6,169,960 B1 | * | 1/2001 | Ehrics | 702/36 |
| 6,181,975 B1 | * | 1/2001 | Gross et al. | 700/29 |
| 6,202,181 B1 | * | 3/2001 | Ferguson et al. | 714/724 |
| 6,210,983 B1 | * | 4/2001 | Atchison et al. | 438/14 |
| 6,252,976 B1 | * | 6/2001 | Schildkraut et al. | 382/117 |
| 6,292,574 B1 | * | 9/2001 | Schildkraut et al. | 382/117 |
| 6,311,139 B1 | * | 10/2001 | Kuroda et al. | 702/81 |
| 6,314,379 B1 | * | 11/2001 | Hu et al. | 702/81 |
| 6,324,481 B1 | * | 11/2001 | Atchison et al. | 702/84 |
| 6,349,589 B1 | * | 2/2002 | Zhou | 73/40 |
| 6,381,374 B1 | * | 4/2002 | Pourjavid | 382/275 |
| 6,404,206 B1 | * | 6/2002 | Sperschneider | 324/537 |
| 6,415,276 B1 | * | 7/2002 | Heger et al. | 706/52 |

FOREIGN PATENT DOCUMENTS

JP          10-326816          12/1998

* cited by examiner

*Primary Examiner*—John Barlow
*Assistant Examiner*—Demetrius Pretlow
(74) *Attorney, Agent, or Firm*—Burns, Doane, Swecker & Mathis, LLP

(57) ABSTRACT

Disclosed is an abnormality-cause identifying apparatus including: a retrieving unit for retrieving quality data conforming to retrieving conditions; and a computing unit for computing mean values and standard deviations of the retrieved quality data, the computing unit further computing the likelihood of abnormality of each of manufacturing apparatuses, on the basis of the mean values and the standard deviations.

4 Claims, 5 Drawing Sheets

QUALITY DATA (FRACTION DEFECTIVE) DISTRIBUTION IN POPULATION

SAMPLED QUALITY DATA (FRACTION DEFECTIVE) DISTRIBUTION

QUALITY DATA DISTRIBUTION (APPARATUS-DEPENDENT)

TEST VALUE DISTRIBUTION
(INCLUDING FRACTION
DEFECTIVE)

ABNORMALITY-CAUSE IDENTIFYING APPARATUS AND METHOD

BACKGROUND OF THE INVENTION

1. Field of the Invention

The present invention generally relates to abnormality-cause identifying apparatuses and methods and, more particularly, to an abnormality-cause identifying apparatus and an abnormality-cause identifying method for identifying a manufacturing apparatus or the like that causes an abnormality.

2. Description of the Related Art

FIG. 8 is a flowchart of steps constituting a conventional abnormality-cause identifying method. In FIG. 8, step ST1 is carried out to set conditions (search criteria) for retrieving quality data and history data. Step ST2 is performed to retrieve from a database the quality data and history data conforming to the retrieving conditions. Step ST3 is executed to compute a mean value of quality data relating to each of manufacturing apparatuses constituting a production line. Step ST4 is effected to compare the mean value of quality data relating to each of the manufacturing apparatuses with the currently stored applicable normal-state data (data in effect when no abnormality is present). If the mean value is judged to significantly deviate from the normal-state data, it is estimated that the corresponding manufacturing apparatus causes the abnormality.

Given below is a description of the operation involved in abnormality-cause identification according to the related art.

For example, a semiconductor device is fabricated using a plurality of manufacturing apparatuses in a plurality of processes as shown in FIG. 9.

The products are inspected in intermediate and final stages of the manufacturing. If an abnormality is found in any of the products, manufacturing apparatuses that cause the abnormality are identified.

More specifically, step ST1 is first carried out to set conditions for retrieving quality data (e.g., data subject to computation in an intermediate inspection process and denoting a fraction defective of the manufacturing apparatuses) and history data relating to each manufacturing process (e.g. data indicative of processing results of the manufacturing apparatuses) such that the retrieved data are used to identify an apparatus suspected to have caused the abnormality, the quality data and history data being collected in diverse manufacturing processes and stored in a database. The retrieving conditions illustratively include products to be manufactured, processes to be inspected, periods to be covered, applicable quality items, history of applicable processes, and processing units involved.

In step ST2, the quality data and history data conforming to the established conditions are retrieved from the database. For example, if a part or all of the processes in FIG. 9 are suspected, then a part or all of the processes may be designated as the retrieving conditions. Then, the quality data and history data relating to the manufacturing apparatuses involved in the designated part or all of the processes are retrieved.

Step ST3 is then executed to compute a mean value of the quality data relating to each of the manufacturing apparatuses involved in the designated part or all of the processes. Illustratively, if the manufacturing apparatuses A and B are involved, a mean value of the quality data relating to the manufacturing apparatus A and a mean value of the quality data relating to the manufacturing apparatus B are computed.

Finally, step ST4 is carried out to compare the mean value of the quality data relating to each manufacturing apparatus with the currently stored normal-state data. Illustratively, where the manufacturing apparatuses A and B are involved in part or all of the manufacturing processes, a comparison is made between the mean value of the quality data relating to the manufacturing apparatus A and the normal-state data relevant to the apparatus A, and another comparison is made between the mean value of the quality data relating to the manufacturing apparatus B and the normal-state data relevant to the apparatus B.

If the comparison yields a difference of, for example, at least 20 percent between the normal-state data and the quality data mean value of a given manufacturing apparatus, that apparatus is identified as having caused the abnormality. The outcome of the identification is printed or otherwise displayed.

After the suspected manufacturing apparatus has been identified as described, the user determines whether or not the abnormality has indeed occurred on the basis of various history data relating to the apparatus in question.

Since the conventional abnormality-cause identifying method is constituted as outlined above, a small number of quality data items on manufacturing apparatuses tend to lower the accuracy of quality data mean values serving as a pointer to an apparatus suspected of the abnormality (hereinafter, such an apparatus will also be referred to as a defective apparatus). Where a defective apparatus cannot be identified accurately, there is a likelihood that manufacturing apparatuses that are not the cause of the abnormality may be processed for determination of the cause of abnormality in advance of the defective apparatus, thus making it difficult to efficiently identify the apparatus that caused the abnormality.

FIG. 10 is a graphic representation of an exemplary fraction defective distribution of manufacturing apparatuses. In the example of FIG. 10, the manufacturing apparatus having a fraction defective of about 3.5 percent is most likely to caused the abnormality. In that case, the apparatus with the fraction defective of 3.5 percent should be identified as causing the abnormality. However, as the mean values of quality data decline in their accuracy, a manufacturing apparatus with a fraction defective of about 2.3 percent may be mistakenly identified as having caused the abnormality.

SUMMARY OF THE INVENTION

It is therefore an object of the present invention to overcome the above and other deficiencies of the prior art and, more particularly, to provide an abnormality-cause identifying apparatus and an abnormality-cause identifying method for efficiently identifying an apparatus causing an abnormality.

The aforementioned objects can be achieved by an abnormality-cause identifying apparatus comprising: setting means for setting conditions for retrieving quality data; retrieving means for retrieving quality data conforming to the retrieving conditions set by the setting means; and computing means for computing mean values and standard deviations of the conforming quality data retrieved by the retrieving means, and for computing a likelihood of abnormality of each of candidates that could have caused an abnormality, on the basis of the mean values and standard deviations.

The abnormality-cause identifying apparatus may further comprise determining means for subjecting the candidates to determination as to abnormality, in a descending order of magnitude of likelihood of abnormality.

If an upper limit and a lower limit of quality data are set by the setting means, then the retrieving means may retrieve, from the conforming quality data, quality data in excess of the upper limit and quality data below the lower limit before outputting the retrieved quality data.

The abnormality-cause identifying apparatus may further comprise test value computing means for computing a test value and a fraction defective of each of the candidates, on the basis of the mean values and standard deviations of the quality data, and for computing the likelihood of abnormality of the candidates, on the basis of the test value and the fraction defective.

The aforementioned objects can be achieved by an abnormality-cause identifying method comprising the steps of: setting conditions for retrieving quality data; retrieving quality data conforming to the retrieving conditions; and computing mean values and standard deviations of the conforming quality data, and computing a likelihood of abnormality of each of candidates that could have caused an abnormality, on the basis of the mean values and standard deviations.

The abnormality-cause identifying method may further comprise the step of subjecting the candidates to determination as to abnormality, in a descending order of magnitude of likelihood of abnormality.

The abnormality-cause identifying method may further comprise the step of retrieving, if an upper limit and a lower limit of quality data are set, from the conforming quality data, quality data in excess of the upper limit and quality data below the lower limit before outputting the retrieved quality data.

The abnormality-cause identifying method may further comprise the steps of computing a test value and a fraction defective of each of the candidates, on the basis of the mean values and standard deviations of the quality data, and computing the likelihood of abnormality of the candidates, on the basis of the test value and the fraction defective.

A plurality of manufacturing apparatuses may be considered as the candidates.

A plurality of manufacturing materials may be considered as the candidates.

A plurality of manufacturing conditions may be considered as the candidates.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Figure 1:
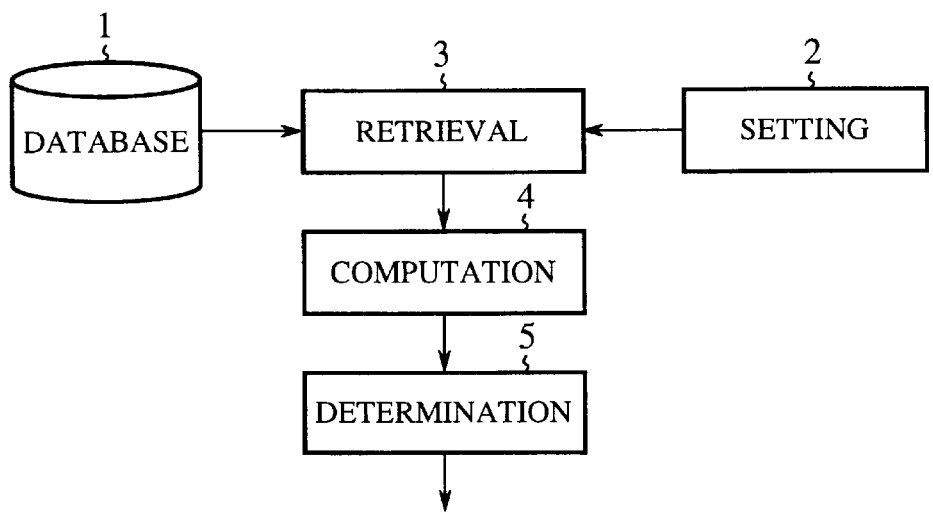
FIG. 1 is a block diagram of an abnormality-cause identifying apparatus according to a first embodiment of the present invention.

Preferred embodiments of the present invention will now be described with reference to the accompanying drawings.
First Embodiment FIG. 1 is a block diagram of an abnormality-cause identifying apparatus according to a first embodiment of the present invention. In FIG. 1, reference numeral 1 denotes a database that stores quality data relating to manufacturing apparatuses and collected in various manufacturing processes. Reference numeral 2 denotes a setting means for setting conditions for retrieving quality data. Reference numeral 3 represents a retrieving means for retrieving from the database 1 the quality data conforming to the retrieving conditions set by the setting means 2. Reference numeral 4 indicates a computing means for computing mean values and standard deviations of the quality data retrieved by the retrieving means 3 and for computing the likelihood that each of the manufacturing apparatuses (i.e., an abnormality-cause candidate) caused the abnormality, on the basis of the mean values and standard deviations. Reference numeral 5 signifies a determining means for subject the manufacturing apparatuses to determination as to the abnormality, in the descending order of magnitudes of the likelihood computed by the computing means 4 for the plurality of manufacturing apparatuses.

Figure 2:
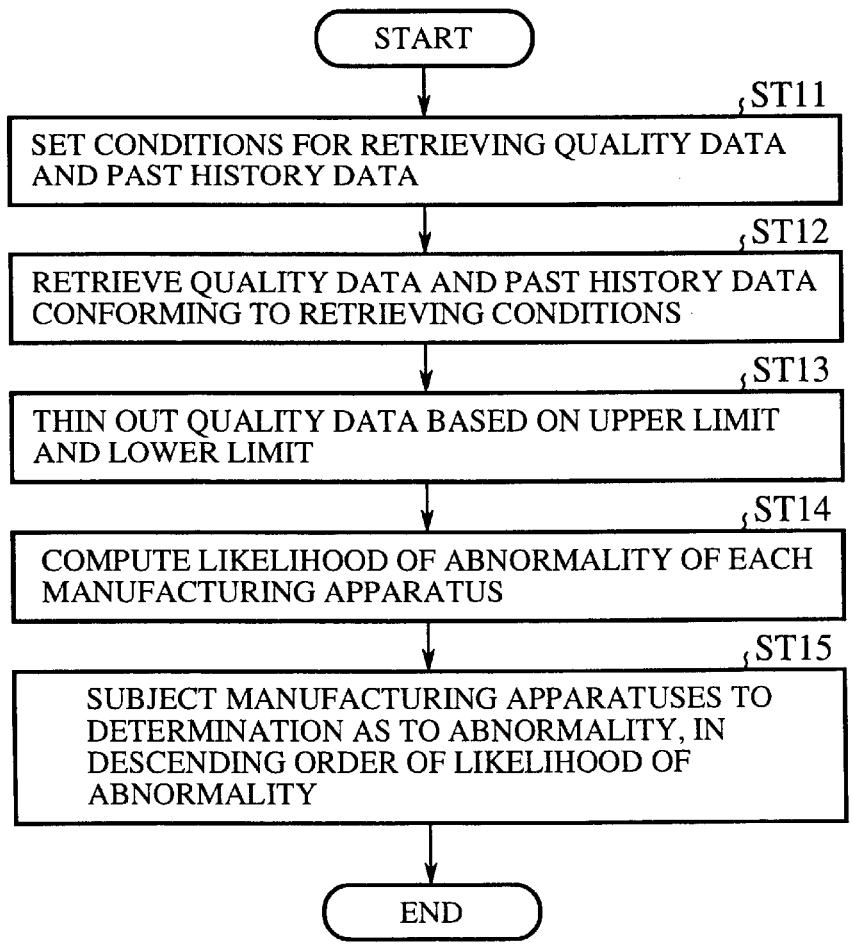
FIG. 2 is a flowchart of steps constituting an abnormality-cause identifying method according to the first embodiment.

FIG. 2 is a flowchart of steps constituting an abnormality-cause identifying method according to the first embodiment.

The first embodiment of the invention operates as follows. In step S11, the setting means 2 is used to set conditions for retrieving quality data relating to the manufacturing apparatuses (e.g., data subject to computation in an intermediate inspection process and denoting a fraction defective of the manufacturing apparatuses) and history data relating to manufacturing processes (e.g. data indicative of processing results of the manufacturing apparatuses), such that the retrieved data are used to identify an apparatus suspected to have caused the abnormality. The retrieving conditions illustratively include products to be manufactured, processes to be inspected, periods to be covered, applicable quality items, history of applicable processes, and processing units involved.

Figure 3:
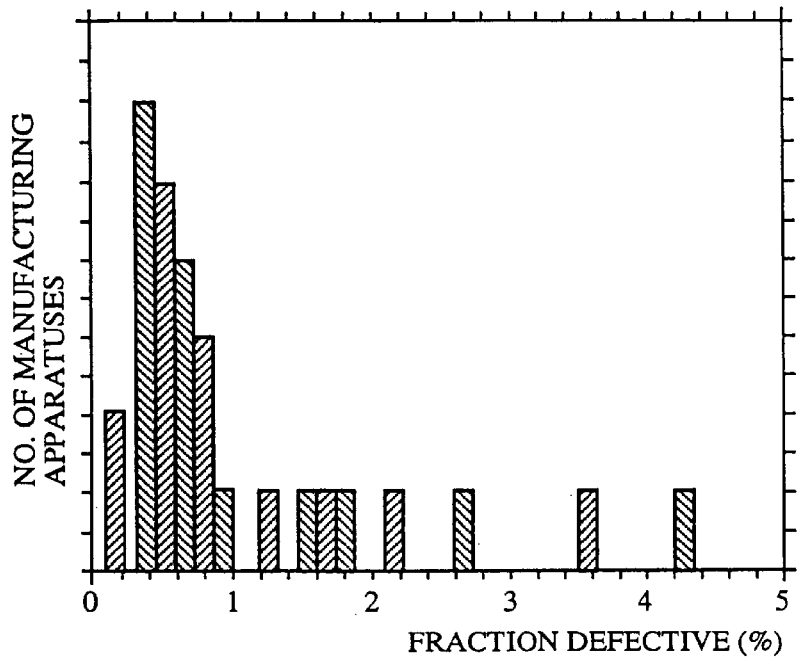
FIG. 3 is a graphic representation of an exemplary quality data distribution in a population.
Figure 4:
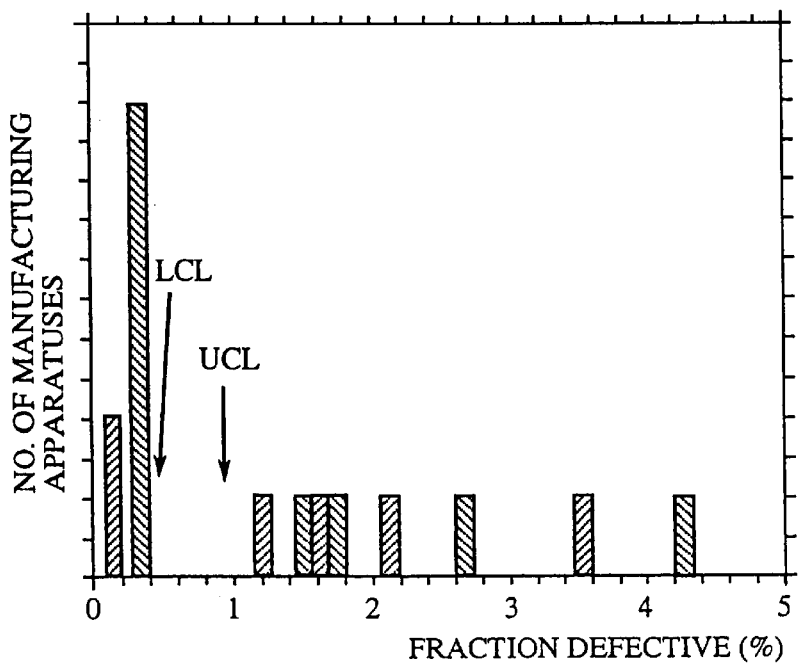
FIG. 4 is a graphic representation of an exemplary sampled quality data distribution.
Figure 9:
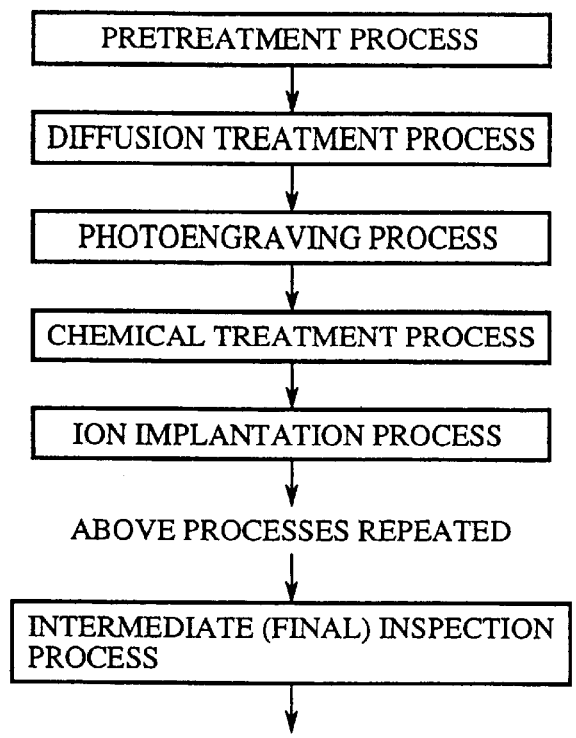
FIG. 9 is a flowchart of conventional processes for fabricating semiconductor devices.
Figure 10:
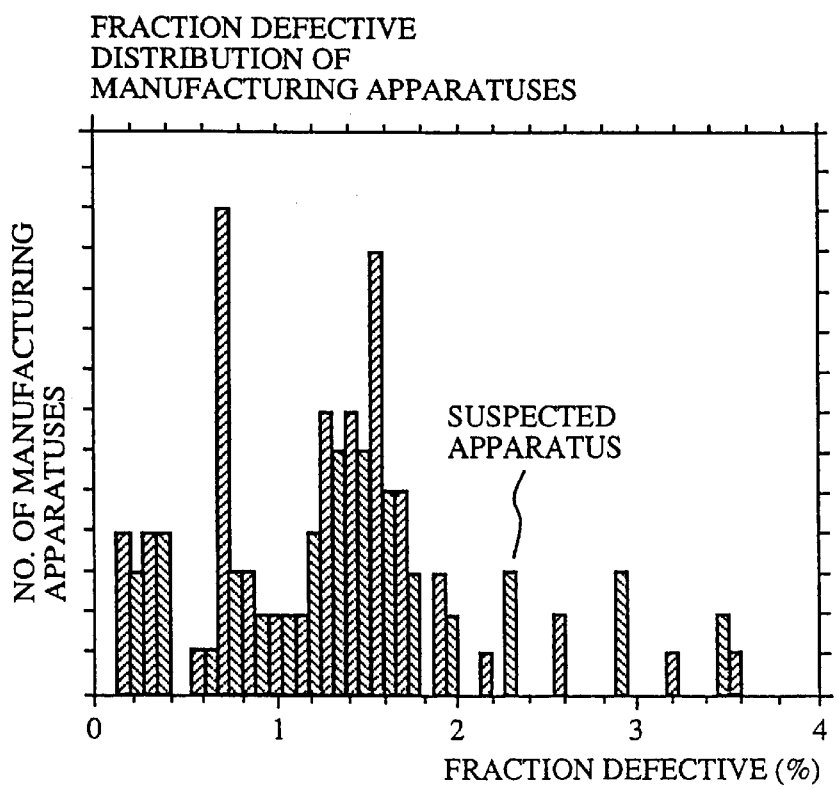
FIG. 10 is a graphic representation of an conventional exemplary fraction defective distribution of manufacturing apparatuses.

In step ST12, the retrieving means 3 retrieves from the database 1 the quality data and history data conforming to the established retrieving conditions. For example, if a part or all of the processes in FIG. 9 are suspected, then a part or all of the processes may be designated as retrieving conditions. Then the retrieving means 3 retrieves the quality data and history data relating to the manufacturing apparatuses relevant to the designated part or all of the processes.

Where the setting means 2 sets an upper limit of quality data (i.e., a setting value for quantitatively identifying abnormal manufacturing apparatuses) and a lower limit of quality data (for quantitatively identifying normal manufacturing apparatuses), the retrieving means 3 isolates quality data in excess of the upper limit and quality data below the lower limit (see FIG. 4) from the quality data conforming to the retrieving conditions (see FIG. 3). The retrieved quality data are output to the computing means 4 (step ST13). Isolation of the quality data with regard to the upper and lower limits is carried out to reduce the number of data items processed, so that working loads on the computer in use may be alleviated.

In step ST14, the computing means 4 computes mean values and standard deviations of the quality data retrieved by the retrieving means 3. The mean values and standard deviations thus computed are used to calculate the likelihood of abnormality of each manufacturing apparatus.

More specifically, the computations proceed as shown below involving a mean value $X_t$ of all quality data $X_i$ (hereinafter, referred to as mean value in population) output by the retrieving means 3, and a standard deviation a of the quality data $X_i$. The mean value in population $X_t$ is calculated as follows:

$$X_i = \frac{\sum_{i=1}^{N} X_i}{N} \quad (1)$$

where, $X_i$ denotes quality data, and N represents the number of quality data items output by the retrieving means 3. The standard deviation a is computed as follows:

$$\sigma = \sqrt{\frac{N * \sum_{i=1}^{N} X_i^2 - \left(\sum_{i=1}^{N} X_i\right)^2}{N(N-1)}} \quad (2)$$

Figure 5:
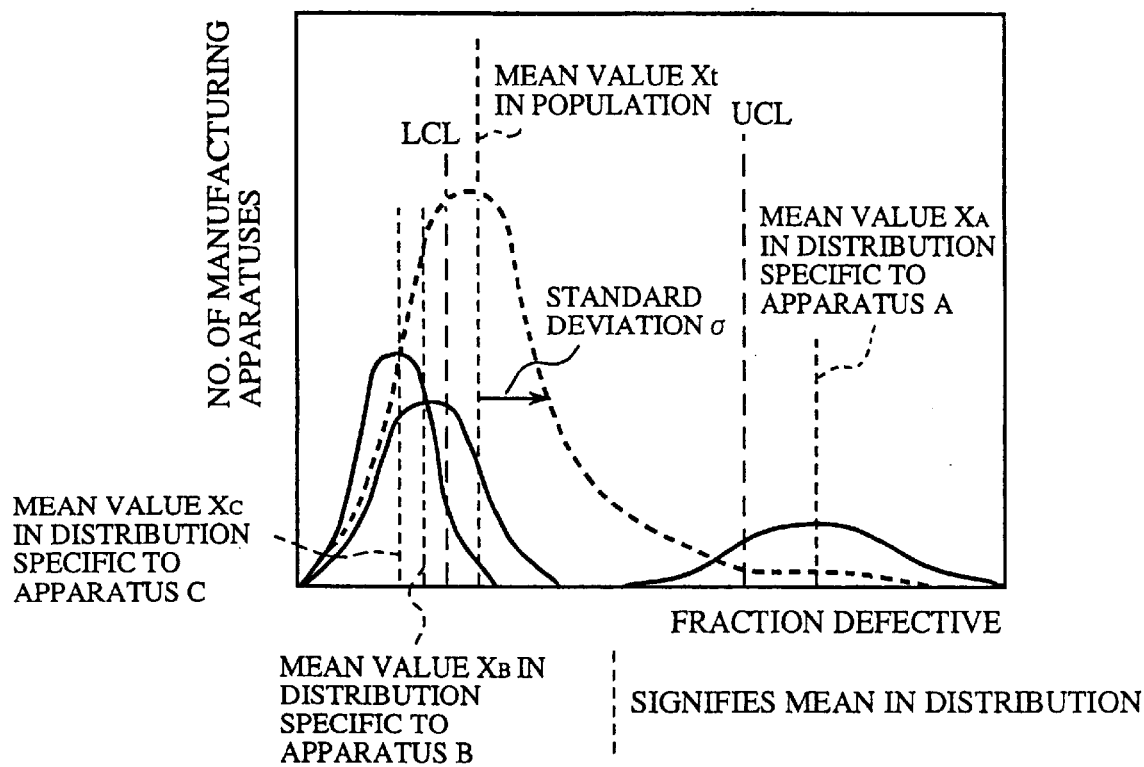
FIG. 5 is a graphic representation of a quality data distribution.
Figure 7:
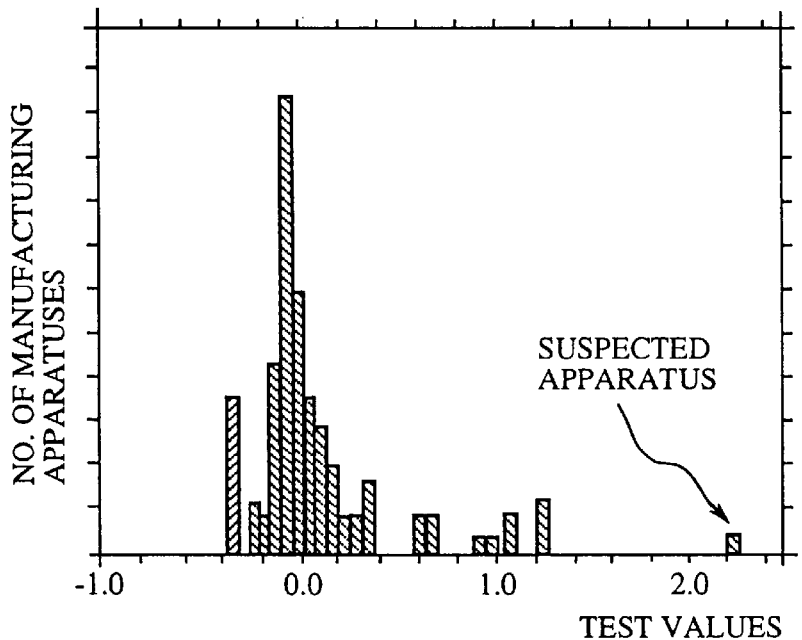
FIG. 7 is a graphic representation of an exemplary test value distribution.
Figure 8:
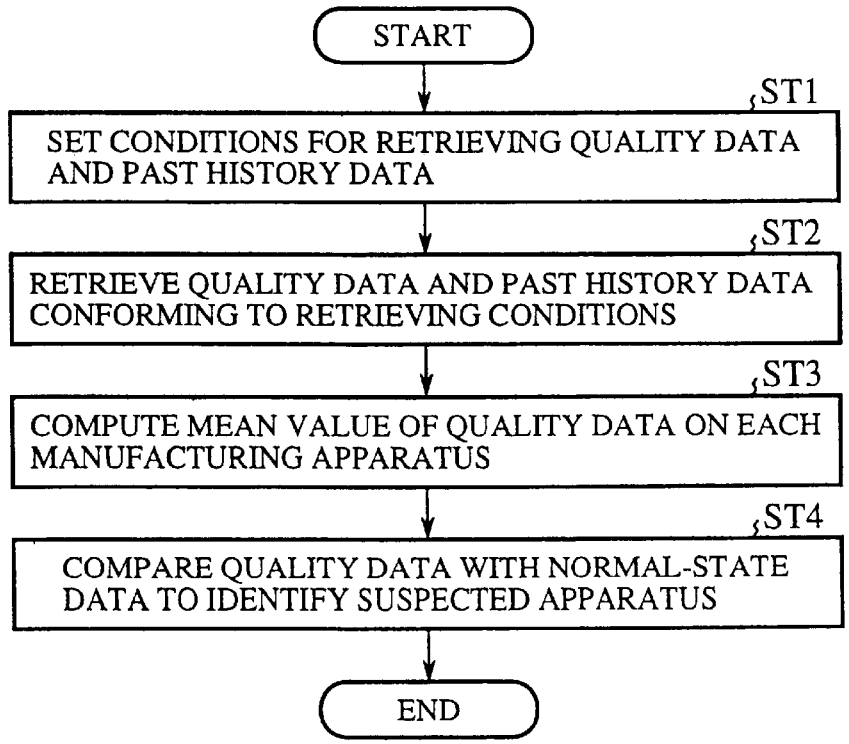
FIG. 8 is a flowchart of steps constituting a conventional abnormality-cause identifying method.

After computing the mean value in population $X_t$ and the standard deviation σ, the computing means 4 calculates a mean value of the quality data relating to each manufacturing apparatus (referred to as mean value of apparatus-specific distribution). With these values acquired, the computing means 4 computes a test value $K_A$ of each manufacturing apparatus as shown below. The test value per manufacturing apparatus represents a quantitative difference between the distribution in population and a distribution specific to the manufacturing apparatus in question (see FIGS. 5 and 7). The test value $K_A$ of a manufacturing apparatus A is given as follows:

$$K_A = \frac{X_A - X_t}{\frac{\sigma}{\sqrt{n_A}}} \quad (3)$$

$$X_A = \frac{\sum_{j=1}^{n_A} X_j}{n_A} \quad (4)$$

where, $n_A$ denotes the number of quality data items relating to the manufacturing apparatus A, and $X_A$ denotes a mean value of the quality data relating to the manufacturing apparatus A.

Figure 6:
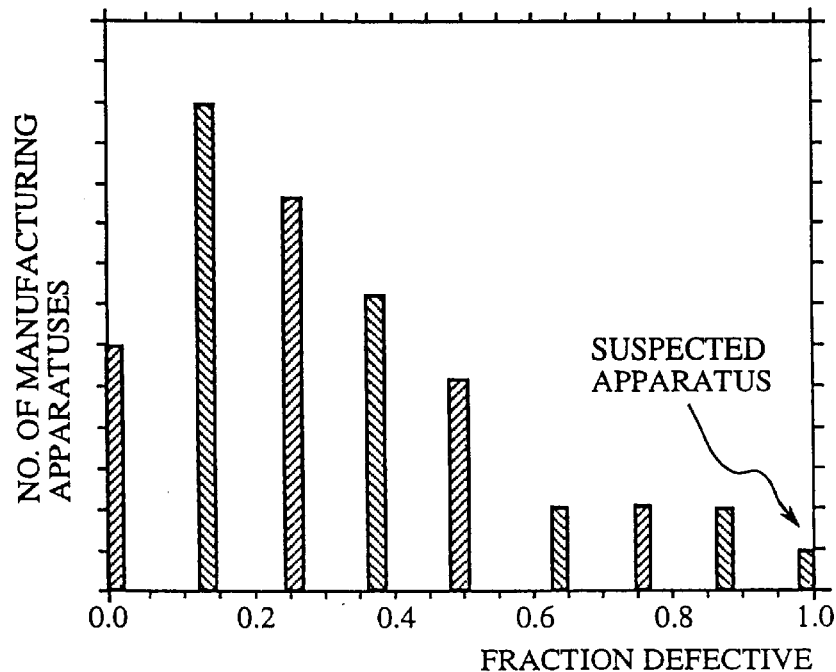
FIG. 6 is a graphic representation of an exemplary fraction defective distribution.

Furthermore, the computing means 4 computes a fraction defective of each manufacturing apparatus (see FIG. 6). With the fraction defective and test value of each manufacturing apparatus thus obtained, the computing means 4 calculates the likelihood of abnormality $E_A$ of the apparatus in question. The likelihood of abnormality expresses quantitatively the probability of a given manufacturing apparatus being a faulty apparatus having caused the abnormality. The likelihood of abnormality $E_A$ of the manufacturing apparatus A is computed as follows:

$$R_A = \frac{H_A}{S} \quad (6)$$

where, $R_A$ denotes the fraction defective of the manufacturing apparatus A, $H_A$ represents the number of abnormal quality data items relating to the manufacturing apparatus A, and S denotes the number of abnormal quality data items relating to all the manufacturing apparatuses involved.

After the computing means 4 has computed the likelihood of abnormality of all manufacturing apparatuses, control is turned to step ST15 where the determining means 5 subjects the manufacturing apparatuses to determination as to the abnormality, in the descending order of magnitude of likelihood of abnormality. That is, the greater the likelihood of abnormality, the earlier the manufacturing apparatus is subject to determination as to abnormality. A check is made to see if the apparatus in question is actually abnormal based on the various history data.

As described above and according to the first embodiment of the present invention, the retrieving means 3 computes mean values and standard deviations of the quality data retrieved. The mean values and standard deviations thus acquired are used to calculate the likelihood of abnormality of each of the manufacturing apparatuses. Accordingly, the probability of each manufacturing apparatus being a faulty apparatus having caused the abnormality is computed. By subjecting the manufacturing apparatuses to the determination as to abnormality in the descending order of magnitude of likelihood of abnormality, a suspected apparatus is efficiently identified.

Second Embodiment

The first embodiment was described as involving a plurality of manufacturing apparatuses as abnormality-cause candidates. Alternatively, a plurality of manufacturing materials may be considered as candidates that could have caused the abnormality, according to a second embodiment of the present invention. The second embodiment offers the advantage of efficiently identifying a manufacturing material that caused the abnormality.

Third Embodiment

Instead of considering multiple manufacturing apparatuses as candidates, as in the first embodiment above, a plurality of manufacturing conditions may be considered as candidates that could have caused the abnormality, according to a third embodiment of the present invention. The third embodiment offers the advantage of efficiently identifying a manufacturing condition that caused the abnormality.

Various advantages of the present invention will be summarized below.

By computing mean values and standard deviations of quality data retrieved by a retrieving means, and computing the likelihood of abnormality of each of candidates that could have caused an abnormality on the basis of the mean values and the standard deviations, it is possible to efficiently identify the cause of the abnormality.

By subjecting candidates for abnormality to determination as to abnormality, in the descending order of magnitude of likelihood of abnormality, it is possible to efficiently identify the cause of the abnormality.

According to one aspect of the invention, if an upper limit and a lower limit of quality data are set by the setting means, then the retrieving means may retrieve, from the quality data informing to the retrieving conditions, quality data in excess of the upper limit and quality data below the lower limit before outputting the retrieved quality data. By reducing the number of data items to be processed, this preferred construction helps alleviate working loads on the computer in use.

The test value computing means according to the invention computes a test value and a fraction defective of each of the candidates of abnormality, on the basis of the mean values and the standard deviations of the quality data. The test value computing means further computes the likelihood of abnormality of the candidates, on the basis of the test value and the fraction defective.

This preferred construction permits acquisition of probabilities of abnormality.

According to the invention, a plurality of manufacturing apparatuses may be considered as candidates that could have caused an abnormality. With this, it is possible to efficiently identify an apparatus that caused the abnormality.

According to the invention, a plurality of manufacturing apparatuses may be considered as candidates that could have caused an abnormality. With this, it is possible to efficiently identify an apparatus that caused the abnormality.

What is claimed is:

1. An abnormality-cause identifying apparatus comprising:

setting means for setting conditions for retrieving quality data;

retrieving means for retrieving quality data conforming to the retrieving conditions set by said setting means; and computing means for computing, in a population including a plurality of manufacturing candidates that could have caused an abnormality, mean values and standard deviations of the conforming quality data retrieved by said retrieving means, and for computing a likelihood of abnormality of each of the manufacturing candidates, on the basis of the mean values and standard deviations.

2. The abnormality-cause identifying apparatus according to claim 1, further comprising determining means for subjecting the candidates to determination as to abnormality, in a descending order of magnitude of likelihood of abnormality.

3. The abnormality-cause identifying apparatus according to claim 1, wherein, if an upper limit and a lower limit of quality data are set by said setting means, then said retrieving means retrieves, from said conforming quality data, quality data in excess of said upper limit and quality data below said lower limit before outputting the retrieved quality data.

4. The abnormality-cause identifying apparatus according to claim 1, further comprising test value computing means for computing a test value and a fraction defective of each of the candidates, on the basis of the mean values and standard deviations of the quality data, and for computing the likelihood of abnormality of the candidates, on the basis of the test value and the fraction defective.

* * * * *